(12) United States Patent
Su

(10) Patent No.: US 12,381,098 B2
(45) Date of Patent: Aug. 5, 2025

(54) WAFER OPTICAL PROCESSING DEVICE AND SINTERING FURNACE

(71) Applicant: Illinois Tool Works Inc., Glenview, IL (US)

(72) Inventor: Wenhua Su, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 691 days.

(21) Appl. No.: 17/636,266

(22) PCT Filed: Aug. 18, 2020

(86) PCT No.: PCT/US2020/046819
§ 371 (c)(1),
(2) Date: Feb. 17, 2022

(87) PCT Pub. No.: WO2021/034840
PCT Pub. Date: Feb. 25, 2021

(65) Prior Publication Data
US 2022/0277970 A1   Sep. 1, 2022

(30) Foreign Application Priority Data

Aug. 20, 2019 (CN) .......................... 201910768522.9
Aug. 20, 2019 (CN) .......................... 201921357209.8

(51) Int. Cl.
*H01L 21/67* (2006.01)
*H01L 21/677* (2006.01)

(52) U.S. Cl.
CPC .. *H01L 21/67115* (2013.01); *H01L 21/67103* (2013.01); *H01L 21/6776* (2013.01)

(58) Field of Classification Search
CPC ......... H01L 21/67115; H01L 21/67103; H01L 31/1864; H01L 21/6776; H01L 31/206; H10F 71/107; H10F 71/128
See application file for complete search history.

(56) References Cited

U.S. PATENT DOCUMENTS

2012/0269226 A1* 10/2012 Parks ................ H01L 21/67109
373/113
2019/0249923 A1    8/2019 Ruf et al.
(Continued)

FOREIGN PATENT DOCUMENTS

CN         210379090      4/2020
WO    WO-2012009636 A1 *  1/2012   .......... F27B 17/0025
(Continued)

OTHER PUBLICATIONS

Int'l Search Report and Written Opinion Appln No. PCT/US2020/046819 mailed Nov. 17, 2020.

*Primary Examiner* — John P. Dulka
(74) *Attorney, Agent, or Firm* — McAndrews, Held & Malloy, Ltd.

(57) ABSTRACT

The present application provides a wafer optical processing device and a sintering furnace, said wafer optical processing device comprising: a wafer support device (140a, 140b), an upper light source device (402), and a lower light source device (502). Said wafer support device is provided with a support piece (305), said support piece being configured to be capable of supporting said wafer above said upper surface; said upper light source device is disposed above said wafer support device and is configured to provide a light source that illuminates the upper surface of said support piece; said lower light source device is disposed below said wafer support device and is configured to provide a light source that illuminates a lower surface of said support piece. A wafer optical processing device provided by the present application is capable of processing a wafer efficiently.

20 Claims, 4 Drawing Sheets

(56) References Cited

U.S. PATENT DOCUMENTS

2019/0334053 A1* 10/2019 Ruf ................... H01L 21/6776
2021/0114047 A1*  4/2021 Orita ................... B05B 7/1606

FOREIGN PATENT DOCUMENTS

WO      2015124191      8/2015
WO   WO-2016061327 A1 *  4/2016    ........ H01L 21/67115

* cited by examiner

WAFER OPTICAL PROCESSING DEVICE AND SINTERING FURNACE

CROSS-REFERENCE TO RELATED APPLICATIONS

This application is a § 371 of PCT Application No. PCT/US2020/046819, filed Aug. 18, 2020, which claims the benefit of Chinese Patent Application Serial No. 201910768522.9, filed Aug. 20, 2019, and to Chinese Patent Application Serial No. 201921357209.8, filed Aug. 20, 2019. The entireties of PCT Application No. PCT/US2020/046819, Chinese Patent Application Serial No. 201910768522.9, and Chinese Patent Application Serial No. 201921357209.8 are expressly incorporated herein by reference.

FIELD OF THE DISCLOSURE

The present application relates to a wafer optical processing device, in particular to a wafer optical processing device for use in a sintering furnace.

BACKGROUND

Currently, PERC solar cells are among the solar cells that have been put to extensive commercial use; during the production of a PERC solar cell, after a wafer of the solar cell undergoes the sintering procedure, a process occurs in a natural state in which light attenuates and then recovers. This process takes a certain period of time. In order to shorten this period, after the sintering procedure, a wafer of a solar cell is optically processed so that the wafer of the solar cell may complete a process of attenuating and then recovering within a relatively short time. In the current production of solar cell wafers, pipelining processing is always adopted, in which, after undergoing the sintering procedure, a wafer is optically processed to effectively increase the production efficiency.

BRIEF SUMMARY OF THE DISCLOSURE

The present application provides a wafer optical processing device, for optically processing a sintered wafer, comprising: a wafer support device, said wafer support device comprising a support piece, said support piece being provided with an upper surface and a lower surface that are disposed facing each other, said support piece being hollowed out in a direction from the upper surface to the lower surface, said support piece being configured to be capable of supporting said wafer above said upper surface; an upper light source device, said upper light source device being disposed above said wafer support device and configured to provide a light source that illuminates the upper surface of said support piece; and a lower light source device, said lower light source device being disposed below said wafer support device and configured to provide a light source that illuminates the lower surface of said support piece.

The above-described wafer optical processing device is provided, said wafer optical processing device comprising a conveyor belt, said conveyor belt forming said support piece.

The above-described wafer optical processing device is provided, wherein a separation piece is disposed on said conveyor belt, said separation piece being configured to be capable of separating said wafer and the upper surface of said conveyor belt by a specific gap.

The above-described wafer optical processing device is provided, wherein said upper light source device and said lower light source device respectively comprise a plurality of light source modules, and one or more of said plurality of light source modules may be started when a wafer is optically processed.

The above-described wafer optical processing device is provided, wherein said light source module provides an LED light source.

The above-described wafer optical processing device is provided, wherein the maximum light energy that said upper light source device is capable of providing per unit of time is greater than the maximum light energy that said lower light source device is capable of providing per unit of time.

The above-described wafer optical processing device is provided, said wafer optical processing device further comprising: an upper transparent baffle plate, said upper transparent baffle plate being located between said upper light source device and said wafer support device and separated from said upper light source device, a plurality of holes being disposed in said upper transparent baffle plate; and a lower transparent baffle plate, said lower transparent baffle plate being located between said lower light source device and said wafer support device and separated from said lower light source device.

The above-described wafer optical processing device is provided, said wafer optical processing device further comprising: an upper cooling device, said upper cooling device being disposed above said upper light source device to cool said upper light source device, and a lower cooling device, said lower cooling device being disposed below said lower light source device to cool said lower light source device.

The above-described wafer optical processing device is provided, said wafer optical processing assembly further comprising: a housing, said upper light source device and said lower light source device being both located in said housing, said housing comprising air inlets and air outlets, said air inlets being located above said housing, said air outlets being located below said housing, so that an airflow may flow in through said air inlets and flow out through said air outlets.

The present application provides a sintering furnace, said sintering furnace comprising: a wafer sintering processing device; and the above-described wafer optical processing device, said wafer optical processing device being disposed downstream of said wafer sintering processing device.

A wafer optical processing device in the present application can, while guaranteeing an optical processing effect, process the front face and rear face of a wafer at the same time, thus increasing the processing efficiency greatly.

DETAILED DESCRIPTION

Figure 1:
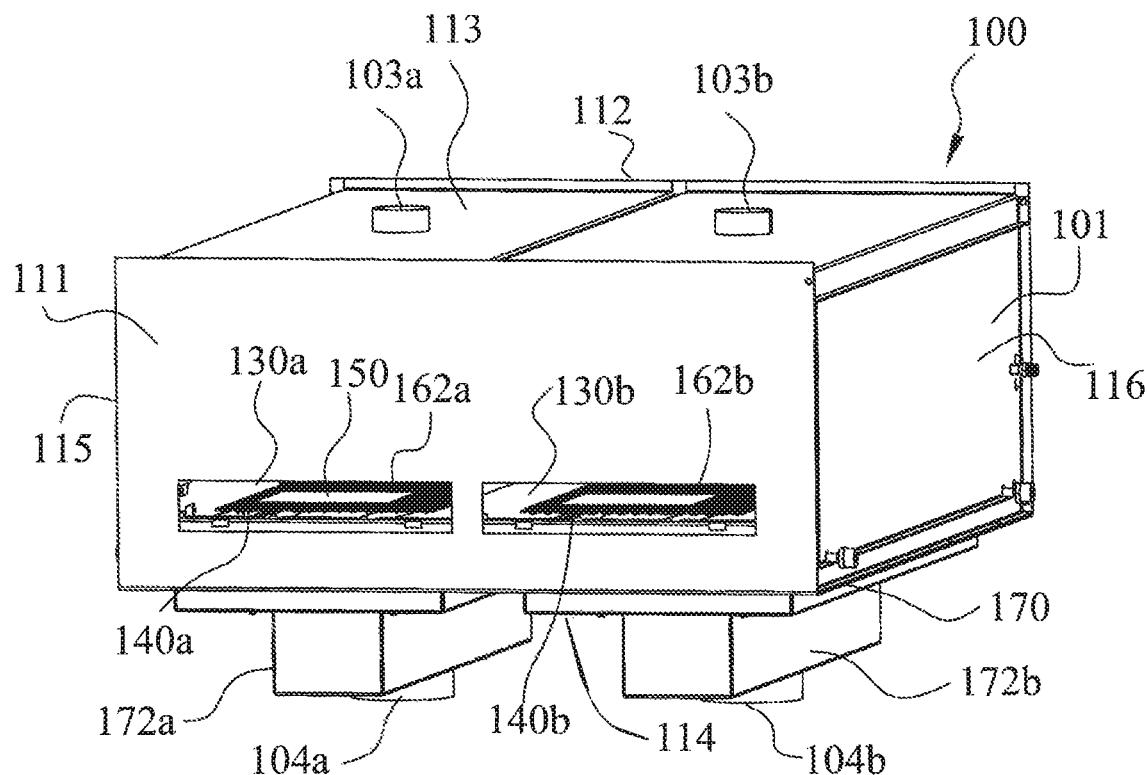
FIG. 1 is a stereoscopic view of a wafer optical processing device.

Specific embodiments of the present invention will be described below with reference to drawings that constitute part of the Description. It should be understood that although terms for indicating directions, such as "front", "rear", "upper", "lower", "left", and "right", are used herein to describe each demonstrative structural part and component of the present application, use of these terms herein is only intended for convenience of explanation, and these terms are determined on the basis of the demonstrative orientations shown in the drawings. Embodiments disclosed by the present application may be disposed in different directions, and so these terms indicating directions are only illustrative, instead of being construed as limiting.

FIG. 1, a stereoscopic view of a wafer optical processing device, is used to explain the external structure of a wafer optical processing device 100. As shown in FIG. 1, the wafer optical processing device 100 is provided with a housing 101 and a pair of conveyor passages 130a, 130b. The housing 101 is provided with a front part 111, a rear part 112, an upper part 113, a lower part 114, a left part 115, and a right part 116, and thus the housing 101 roughly forms a box. In the present application, a direction from the front part 111 to the rear part 112 is called a length direction, a direction from the upper part 113 to the lower part 114 is called a height direction, and a direction from the left part 115 to the right part 116 is called a width direction. The front part 111 is provided with a wafer inlet 162a, 162b, and the rear part 112 is provided with a wafer outlet. The wafer inlet 162a, 162b and the wafer outlet are in communication with an upstream device and a downstream device, respectively. The conveyor passages 130a, 130b are formed between the wafer inlet 162a, 162b and the wafer outlet. In other words, the conveyor passages 130a, 130b penetrate the front part 111 and the rear part 112 of the housing 101. In the conveyor passages 130a, 130b, the wafer support devices 140a, 140b are disposed, for supporting and conveying a wafer 150 to be processed. The upper part 113 of the housing 101 is provided with air inlets 103a, 103b, and the lower part 114 of the housing 101 is provided with air outlets 104a, 104b, the air inlets 103a, 103b or the air outlets 104a, 104b being connected to a fan (not shown in the drawing), so that an airflow may flow into the housing 101 through the air inlets 103a, 103b and then flows out through the air outlets 104a, 104b. In the housing 101, an airflow may take away part of the heat in the housing 101, ensuring that the temperature in the housing 101 is kept within a preset range. The lower part 114 of the housing 101 comprises a base plate 170 and air outlet boxes 172a, 172b, and the four sides of the base plate 170 are respectively connected to the front part 111, the rear part 112, the left part 115, and the right part 116 of the housing. The base plate 170 is provided with an opening; one end of the air outlet boxes 172a, 172b is in communication with the opening on the base plate 170, and the air outlets 104a, 104b are formed at the other end thereof; thus, an airflow may pass through the air outlet boxes 172a, 172b through the opening in the base plate 170 and then flow out through the air outlets 104a, 104b.

Figure 2A:
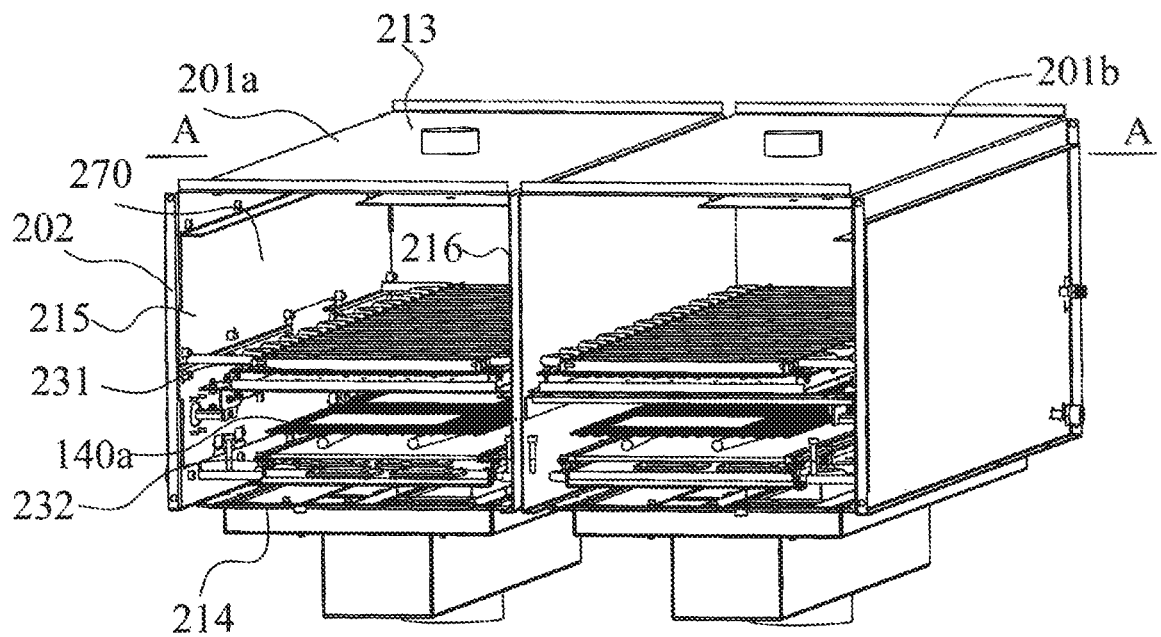
FIG. 2A is a stereoscopic view of the front part and rear part of the wafer optical processing device in FIG. 1 with the housing removed.
Figure 2B:
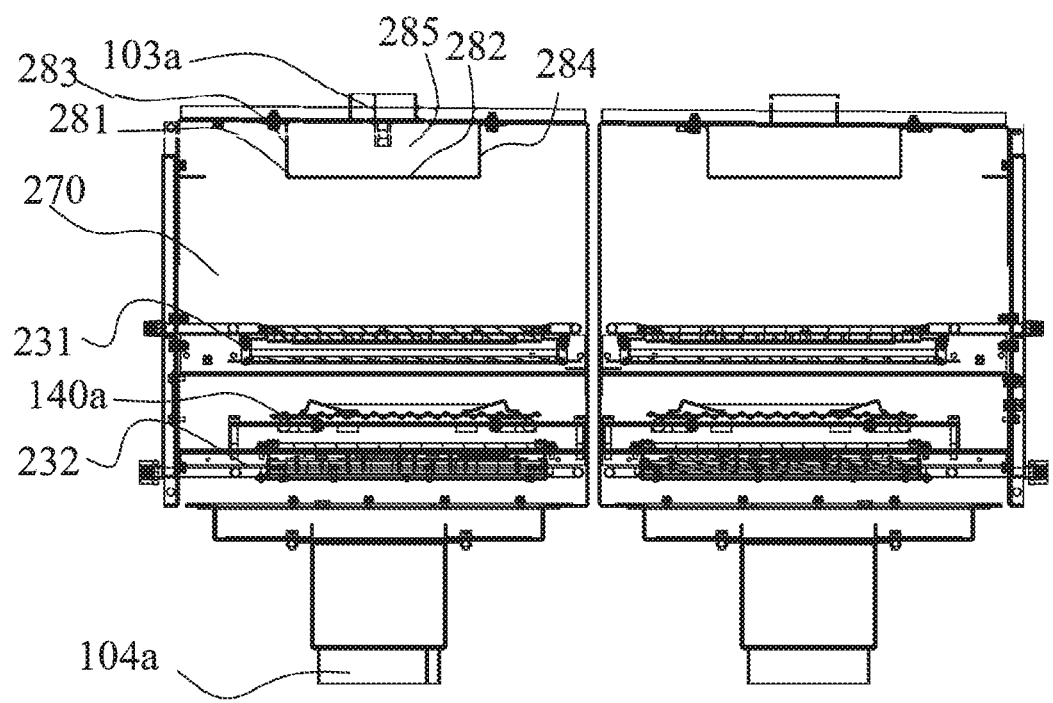
FIG. 2B is a sectional view of the wafer optical processing device in FIG. 2A taken along line A-A.

FIG. 2A is a stereoscopic view of the front part and rear part of the wafer optical processing device in FIG. 1 with the housing removed, showing the internal components of the wafer optical processing device; FIG. 2B is a sectional view of FIG. 2A. In FIG. 2A, the front part 111 and the rear part 112 of the housing 101 are removed, and the internal components of the wafer optical processing device are visible. As shown in FIGS. 2A and 2B, the wafer optical processing device 100 comprises two wafer processing assemblies 201a and 201b that are disposed side by side, wherein the wafer processing assemblies 201a and 201b have completely the same structures; in actual application, both of the wafer processing assemblies 201a and 201b may be used at the same time, or only one of them may be used, depending on need. In another embodiment, one or more wafer processing assemblies may also be disposed. The internal structure of the wafer processing assembly 201a will be described below; the structure of the wafer processing assembly 201b, which is the same as that of the wafer processing assembly 201a, will not be described again.

The wafer processing assembly 201a comprises an upper plate 213, a lower plate 214, a left plate 215, and a right plate 216; the upper plate 213, the lower plate 214, the left plate 215, and the right plate 216 form a ring creating a cylindrical space 270. The air inlet 103a is disposed in the upper plate 213, and the air outlet box 172a is connected to the lower plate 214. A guide rack 281 is disposed below the air inlet 103a; the guide rack 281 extends in the length direction shown in FIG. 2A; the length of the guide rack 281 in the length direction is greater than the diameter of the air inlet 103a and smaller than the length of the upper plate 213 in the length direction. The guide rack 281 is provided with a base plate 282 and lateral plates 283, 284 that are formed extending upwards from both sides of the base plate 282 in the width direction (namely, the left-right direction shown in FIG. 2B), the upper ends of the lateral plates 283, 284 being connected to the upper plate 213 of the wafer processing assembly 201a; thus, the guide rack 281 and the upper plate 213 of the wafer processing assembly 201a form a ring creating a guide passage 285, of which both ends are provided with openings, the guide passage 285 guiding the circulation of an airflow in the housing 101. An airflow that has flowed in through an air inlet 103 flows along the guide passage 285 and flows out through the openings at the front and rear ends of the guide passage 285. In the cylindrical space 270, the wafer support device 140a, the upper optical processing assembly 231, and the lower optical processing assembly 232 are disposed. Both sides of the upper optical processing assembly 231 are respectively connected to the left plate 215 and the right plate 216 by the corresponding support rack, and the upper optical processing assembly 231 is located above the wafer support device 140a and separated from the wafer support device 140a by a specific gap. Likewise, both sides of the lower optical processing assembly 232 are respectively connected to the left plate 215 and the right plate 216, and the lower optical processing assembly 232 is located below the wafer support device 140a and separated from the wafer support device 140a by a specific gap. The upper optical processing assembly 231 and the lower optical processing assembly 232, respectively, optically process the front face and rear face of the wafer 150 placed on the wafer support device 140a, wherein the front face of the wafer 150 faces the upper optical processing assembly 231 and the rear face of the wafer 150 faces the lower optical processing assembly 232.

Figure 3:
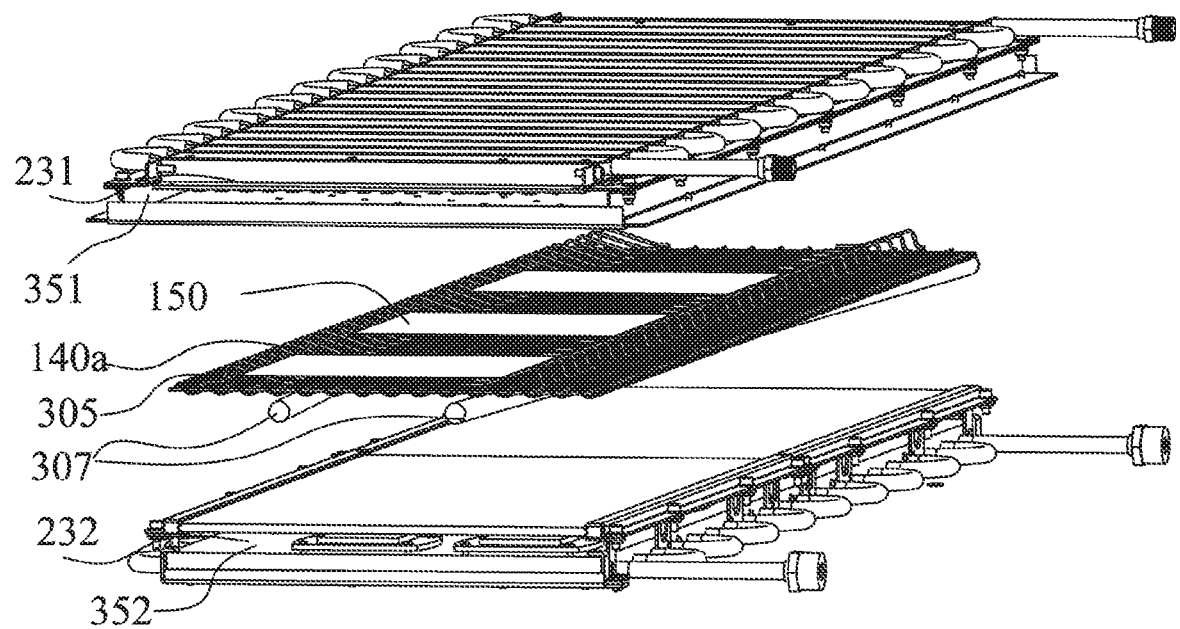
FIG. 3 is a stereoscopic view of the upper optical processing assembly, the wafer support device, and the lower optical processing assembly.

FIG. 3 is a stereoscopic view of the upper optical processing assembly 231, the wafer support device 140a, and the lower optical processing assembly 232; as shown in FIG. 3, the wafer support device 140a comprises a conveyor belt 305 and a pair of quartz rods 307, the conveyor belt 305 being supported by the pair of quartz rods 307. The conveyor belt 305 constitutes a support piece for supporting the wafer 150. Driven by an external force, the conveyor belt 305 moves relative to the quartz rods 307, thereby driving the wafer 150 placed on the conveyor belt 305 to move together, so that the wafer 150 enters the wafer optical processing device 100 through a wafer inlet 162*a*, 162*b* in the front part 111 and then leaves the wafer optical processing device 100 through a wafer outlet in the rear part 112. Note that the drawings in the present application show only the conveyor belt 305 in the wafer optical processing device 100, but not any conveyor belts outside the wafer optical processing device 100. In the apparatus comprising the wafer optical processing device 100, the conveyor belt 305 penetrates the wafer optical processing device 100 and relevant devices upstream and downstream of the wafer optical processing device 100; in other words, after being processed on the conveyor belt 305 by devices upstream of the wafer optical processing device 100, the wafer 150 enters the wafer optical processing device 100 via the conveyor belt 305; when moving through the wafer optical processing device 100, the wafer 150 is first optically processed by the upper optical processing assembly 231 and the lower optical processing assembly 232 and then is conveyed by the conveyor belt 305 to the downstream device in order to be processed in the next procedure.

The upper optical processing assembly 231 and the lower optical processing assembly 232 may each produce light having a certain intensity, thereby, respectively, optically processing the front face and rear face of the wafer 150 to accelerate the process of light attenuation. The conveyor belt 305 is a meshed structure having a hollowed-out portion, and thus light from the lower optical processing assembly 232 may penetrate the hollowed-out portion on the conveyor belt 305 to optically process the rear face of the wafer 150.

Figure 4:
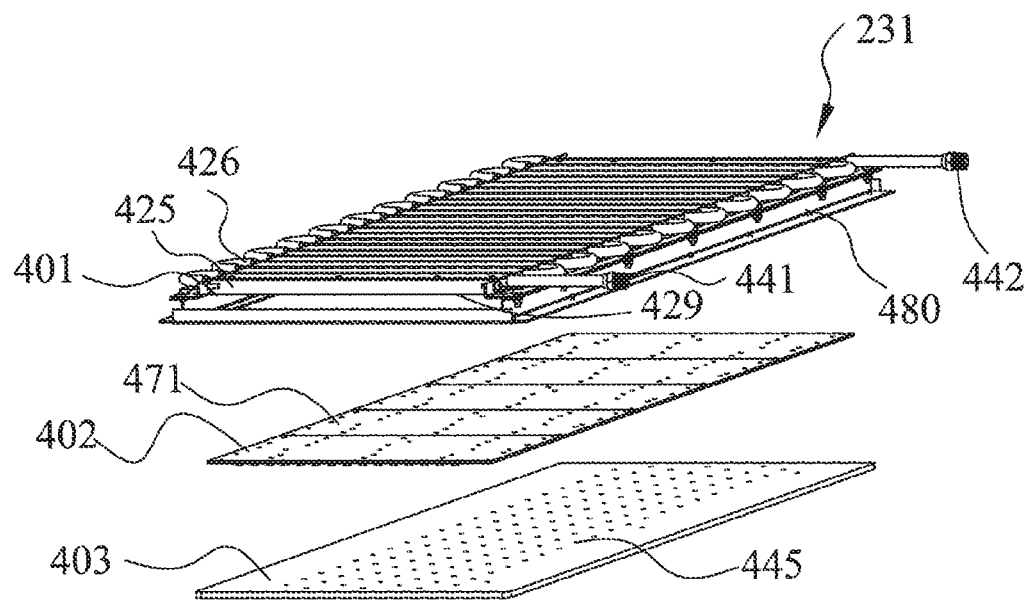
FIG. 4 is an exploded view of the upper optical processing assembly in FIG. 3.

FIG. 4 is an exploded view of the upper optical processing assembly 231 in FIG. 3; as shown in FIG. 4, the upper optical processing assembly 231 comprises an upper cooling device 401, an upper light source device 402, and an upper transparent baffle plate 403. The upper cooling device 401, the upper light source device 402, and the upper transparent baffle plate 403 are fixed together by a support rack 480. The upper light source device 402 is used to provide a light source for illuminating the front face (namely, the upper surface) of the wafer 150, the upper cooling device 401 is used to absorb the heat generated by the upper light source device 402, and the upper transparent baffle plate 403 is used to block foreign substances in the conveyor passage 130*a*, so that they are not prone to adhere to the upper light source device 402. The upper light source device 402 comprises a light source plate 471 that is integrated with a plurality of LED light sources, wherein the light source plate 471 is dividable into a plurality of LED light source modules, and some or all of the LED light source modules may be started as needed in actual application. When operating, the upper light source device 402 generates intense heat; in order to keep the temperature in the wafer processing assembly 201*a* within a suitable range, the upper cooling device 401 is used to absorb part of the heat generated by the upper light source device 402. The upper cooling device comprises a cooling plate 425 and a coil pipe 426 that are made of a metallic material. The cooling plate 425 is roughly platelike and has a certain thickness, the lower surface 429 of the cooling plate 425 is roughly a smooth plane, and the light source plate 471 is connected to the lower surface of the cooling plate 425. The cooling plate 425 is provided with a plurality of grooves formed by being dented inwards from the upper surface, the grooves having a shape that matches the shape of the coil pipe 426 and being used to accommodate the coil pipe 426. The coil pipe 426 is embedded in the cooling plate 425, and the area of contact between the coil pipe 426 and the cooling plate 425 is made as large as possible. The coil pipe 426 is provided with an inlet 441 and an outlet 442, and cooling water flows into the coil pipe through the inlet 441 and then flows out through the outlet 442. Heat generated by the upper light source device 402, through the cooling plate 425 and the coil pipe 426, is conveyed to the interior of the coil pipe 426 and subjected to heat exchange with the cooling water in the coil pipe 426, so that the cooling water absorbs heat and its temperature increases; finally, the cooling water flows out through the outlet 442, taking away part of the heat. The upper transparent baffle plate 403 is disposed below the upper light source device 402, a plurality of holes 445 are disposed in the upper transparent baffle plate 403, and the holes 445 facilitate the circulation of an airflow in a vertical direction around the upper optical processing assembly 431, thus preventing partial overheating near the upper light source device 402. The upper transparent baffle plate 403 is made of glass or another transparent material, capable of preventing, to a certain extent, foreign substances from coming into contact with the upper light source device 402. When a certain amount of foreign substances have accumulated, the upper transparent baffle plate 403 may be wiped and cleaned.

Figure 5:
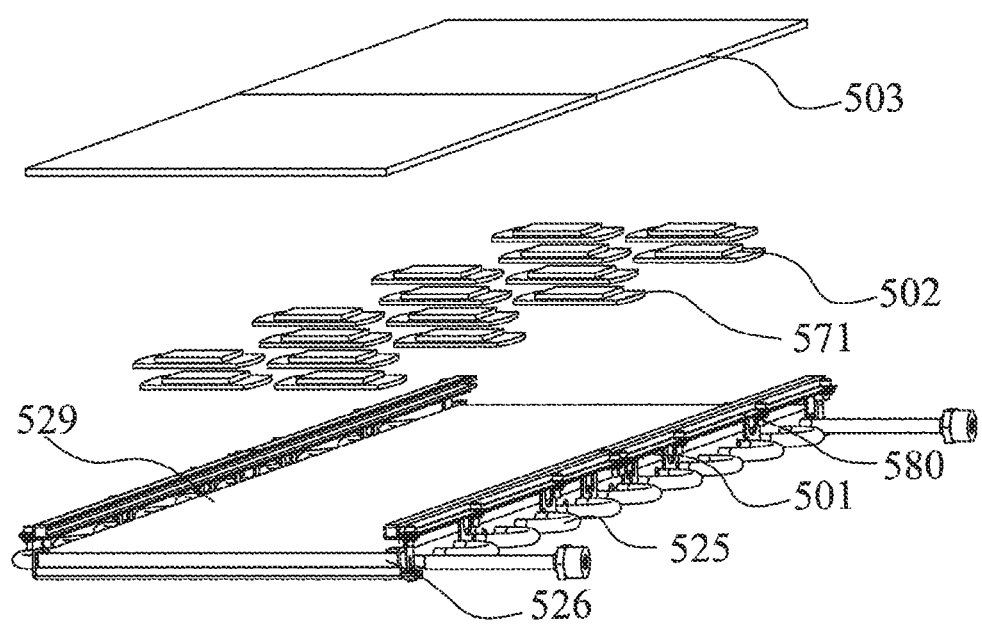
FIG. 5 is an exploded view of the lower optical processing assembly in FIG. 3.

FIG. 5 is an exploded view of the lower optical processing assembly 232 in FIG. 3; similar to the upper optical processing assembly 231 shown in FIG. 4, the lower optical processing assembly 232 comprises a lower cooling device 501, a lower light source device 502, and a lower transparent baffle plate 503. The lower cooling device 501, the lower light source device 502, and the lower transparent baffle plate 503 are fixed together by the support rack 580. The lower light source device 502 is used to provide a light source for illuminating the rear face of the wafer 150, the lower cooling device 501 is used to absorb the heat generated by the lower light source device 502, and the lower transparent baffle plate 503 is used to prevent foreign substances in the conveyor passage 130*a* from adhering to the lower light source device 502. The lower light source device 502 is formed by a plurality of light source modules 571, wherein the light source modules 571 are LED light source modules, and some or all of the LED light source modules 571 may be started as needed in actual application. The plurality of light source modules 571 may be independent of one another and connected to the lower cooling device 501, respectively. The power of the lower light source device 502 and that of the upper light source device 402 may be set to be the same or different, as determined by the processing requirements for the front face and rear face of the wafer 150. In the present application, the optical processing requirement for the front face of the wafer 150 is greater than the optical processing requirement for the rear face of the wafer 150, because the maximum light energy that the upper light source device 402 is capable of providing per unit of time is greater than the maximum light energy that the lower light source device 502 is capable of providing per unit of time. In the present application, a plurality of separate detachable light source modules are used as the lower light source device 502, and an integrated light source module is used as the lower cooling device 501. In another embodiment, a light source module in another form may also be used as needed. The structure of the lower cooling device 501 is the same as the structure of the upper cooling device 401, but the lower cooling device 501 is placed in a direction different from the upper cooling device; the upper surface 529 of the lower cooling device 501 forms a roughly smooth plane, and the coil pipe 526 is mounted into the grooves of the cooling plate 525 from below the cooling plate 525 and thus located in the cooling plate 525. In other words, the lower cooling device 501 and the upper cooling device 401 are disposed facing each other. The light source modules 571 of the lower optical processing assembly 232 are connected to the upper surface 529 of the cooling plate 525. Heat generated by the lower light source device 502, through the cooling plate 525 and the coil pipe 526, is conveyed to the interior of the coil pipe 526 and subjected to heat exchange with the cooling water in the coil pipe 526, so that the cooling water takes away part of the heat. The lower transparent baffle plate 503 is disposed above the lower light source device 502; different from the upper transparent baffle plate 403, the lower transparent baffle plate 503 is provided with no holes; the reason is that, because of the action of gravity and the roughly top-down circulation of an airflow in the housing 101, foreign substances are relatively more prone to be deposited and accumulate on the lower transparent baffle plate 503. The lower transparent baffle plate 503, provided with no holes, is capable of preventing foreign substances from falling on the lower light source device 502 through a hole. The lower transparent baffle plate 503 is made of glass or another transparent material. When a certain amount of foreign substances have accumulated, the lower transparent baffle plate 503 may be wiped and cleaned. In the present application, heat generated by the lower light source device 502 is generally lesser than the heat generated by the upper light source device 402; thus, though the lower transparent baffle plate 503 is provided with no holes, no partial overheating occurs near the lower light source device 502.

Figure 6:
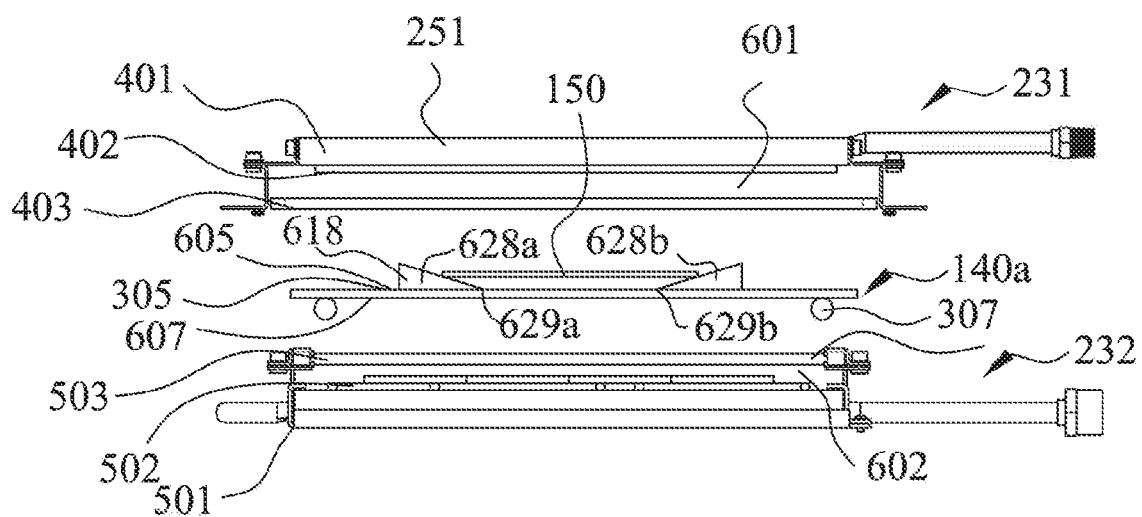
FIG. 6 is a simplified view of the upper optical processing assembly, the wafer support device, and the lower optical processing assembly in FIG. 2B.

FIG. 6 is a simplified view of the upper optical processing assembly 231, the wafer support device 140a, and the lower optical processing assembly 232 in FIG. 2B, showing more clearly the relative position relationship among the abovementioned components. As shown in FIG. 6, the upper light source device 402 of the upper optical processing assembly 231 is pressed close to the lower surface of the upper cooling device 401, so that the upper cooling device 401 may effectively absorb the heat generated by the upper light source device 402. "Pressed close" mentioned herein means being close in distance, but there may also be a specific gap between the upper light source device 402 and the upper cooling device 401. There is a specific gap 601 between the upper transparent baffle plate 403 and the upper light source device 402; thus, in the length direction of the wafer optical processing device 100, an opening 351 is formed between the upper transparent baffle plate 403 and the upper light source device 402 (see FIG. 3). The gap 601 allows an airflow to flow between the upper transparent baffle plate 403 and the upper light source device 402; then, the airflow flows out through the opening 351, thereby taking away part of the heat and preventing partial overheating of the upper light source device 402. In addition, a plurality of holes 445 are disposed in the upper transparent baffle plate 403, the plurality of holes 445 further facilitating the circulation of an airflow so that the airflow may further flow out penetrating the holes 445 from top to bottom.

Similarly, the lower optical processing assembly 232 comprises the lower cooling device 501, the lower light source device 502, and the lower transparent baffle plate 503, wherein the lower light source device 502 is pressed close to the lower surface of the lower cooling device 501, so that the cooling device 501 may effectively absorb the heat generated by the lower light source device 502. "Pressed close" mentioned herein means being close in distance, but there may also be a specific gap between the lower light source device 502 and the lower cooling device 501. There is a specific gap 602 between the lower transparent baffle plate 503 and the lower light source device 502; thus, in the length direction of the wafer optical processing device 100, an opening 352 is formed between the lower transparent baffle plate 503 and the lower light source device 502 (see FIG. 3). The gap 602 allows an airflow to flow between the lower transparent baffle plate 503 and the lower light source device 502; then, the airflow flows out through the opening 352, thereby taking away part of the heat and preventing partial overheating of the lower light source device 502. As described above, the lower transparent baffle plate 503 is provided with no holes, in order to prevent foreign substances from falling on the lower light source device 502 through a hole.

Still referring to FIG. 6, the wafer support device 140a comprises the conveyor belt 305 and the quartz rods 307. The two quartz rods 307 are respectively located on either side of the conveyor belt 305. The conveyor belt 305 is provided with an upper surface 605 and a lower surface 607, the lower surface 607 being roughly a plane and coming into contact with the two quartz rods 307, and thus the two quartz rods 307 support the conveyor belt 305. In the present application, the conveyor belt 305 forms a support piece for supporting the wafer 150. A separation piece 618 is disposed on the upper surface 605 of the conveyor belt 305, and two raised ribs 628a, 628b are formed extending in the extension directions of the conveyor belt 305 on the separation piece 618. An inclined plane extending outwards and upwards is formed on the insides of the two raised ribs 628a, 628b, respectively. The two inclined planes are respectively provided with bottom sides 629a, 629b, and the distance between the bottom sides 629a, 629b is smaller than the width of the wafer 150. Thus, when the wafer 150 is located on the conveyor belt 305, two sides of the wafer 150 in the width direction come into contact with the inclined surfaces or with the tops of the raised ribs 628a, 628b; thus, a specific gap is created between the wafer 150 and the upper surface of the conveyor belt 305, so that the lower surface of the wafer 150 does not come into contact with the conveyor belt, which is conducive to the formation of a smooth lower surface (namely, the rear face of the wafer) on the wafer 150. In the present application, the conveyor belt 305 is a meshed structure; in other words, the conveyor belt 305 is provided with a hollowed-out portion that penetrates the upper surface and lower surface of the conveyor belt 305. Therefore, light from the lower light source device 502 may penetrate the hollowed-out portion and illuminate the lower surface of the wafer 150. In addition, the meshed conveyor belt 305 having a hollowed-out portion facilitates the circulation of airflows on both sides of the conveyor belt 305. The separation piece 618 may be integrated with the meshed conveyor belt 305, for example, being formed by folding upwards a plurality of metallic wires that form the upper part of the meshed conveyor belt, or may be a separately formed component that is connected to the upper surface of the conveyor belt 305.

In the present application, the wafer optical processing device 100 is disposed downstream of a wafer sintering processing device of a sintering furnace, and a wafer, after undergoing the sintering procedure and cooling quickly, is conveyed by the conveyor belt 305 to a wafer inlet of the wafer optical processing device 100. When the wafer 150 is conveyed by the conveyor belt 305 to pass through the wafer optical processing device 100, the upper light source device 402 and the lower light source device 502 of the wafer optical processing device 100 optically process the front face and rear face of the wafer 150, respectively. In this process, the upper light source device 402 and the lower light source device 502 generate intense heat; in order to keep the temperature in the wafer optical processing device 100 within a specific range (for example, 250° C. to 300° C.), cooling water flowing in the upper cooling device 401 and in the lower cooling device 501 may take way part of the heat; in addition, a fan connected to the wafer optical processing device 100 causes an airflow to flow from the air inlet 103a to the air outlet 104a, thus also taking away part of the heat. A fan may adjust its blast volume based on the temperature in the wafer optical processing device 100, increasing its blast volume when the temperature becomes higher and decreasing its blast volume when the temperature becomes lower. When the wafer reaches a wafer outlet of the wafer optical processing device 100, the optical processing has been completed, and the wafer 150 will be conveyed by the conveyor belt to the next procedure. The optical processing takes only 10 seconds to 30 seconds. In the present application, the wafer optical processing device 100 is capable of processing the front face and rear face of a wafer at the same time, thus increasing the processing efficiency greatly. A wafer of which the front face and rear face are thus processed is applicable to an electrode of a solar cell; the front face and rear face of such an electrode may both receive solar energy.

While only certain characteristics of the present invention have been illustrated and described above, those of ordinary skill in the art may make various improvements and alterations to them. Therefore, it should be understood that the attached claims are intended to cover all above-described improvements and alterations that fall into the essential spirit and scope of the present invention.

The invention claimed is:

1. A wafer optical processing device, for optically processing a sintered wafer, the wafer optical processing device comprising:
  a wafer support device, said wafer support device comprising a support piece, said support piece being provided with an upper surface and a lower surface that are disposed facing each other, said support piece being hollowed out in a direction from the upper surface to the lower surface, said support piece being configured to be capable of supporting said wafer above said upper surface;
  an upper light source device, said upper light source device comprising a light source plate that is integrated with a plurality of light source modules, said upper light source device being disposed above said wafer support device and configured to provide a light source that illuminates the upper surface of said support piece; and
  a lower light source device, said lower light source device comprising a plurality of separate detachable light source modules, said lower light source device being disposed below said wafer support device and configured to provide a light source that illuminates the lower surface of said support piece.

2. The wafer optical processing device as claimed in claim 1, wherein said wafer support device comprises a conveyor belt provided with an upper surface, said conveyor belt forming said support piece.

3. The wafer optical processing device as claimed in claim 2, wherein a separation piece is disposed on said conveyor belt, said separation piece being configured to be capable of separating said wafer and the upper surface of said conveyor belt by a specific gap.

4. The wafer optical processing device as claimed in claim 1, wherein one or more of said plurality of light source modules of either the upper light source device or the lower light source device may be started when a wafer is optically processed.

5. The wafer optical processing device as claimed in claim 4, wherein said plurality of light source modules provide an LED light source.

6. The wafer optical processing device as claimed in claim 1, wherein the maximum light energy that said upper light source device is capable of providing per unit of time is greater than the maximum light energy that said lower light source device is capable of providing per unit of time.

7. The wafer optical processing device as claimed in claim 1, wherein said wafer optical processing device further comprises:
  an upper transparent baffle plate, said upper transparent baffle plate being located between said upper light source device and said wafer support device and separated from said upper light source device, a plurality of holes being disposed in said upper transparent baffle plate;
  and a lower transparent baffle plate, said lower transparent baffle plate being located between said lower light source device and said wafer support device and separated from said lower light source device.

8. The wafer optical processing device as claimed in claim 1, wherein said wafer optical processing device further comprises:
  an upper cooling device, said upper cooling device being disposed above said upper light source device to cool said upper light source device,
  and a lower cooling device, said lower cooling device being disposed below said lower light source device to cool said lower light source device.

9. The wafer optical processing device as claimed in claim 1, wherein said wafer optical processing device further comprises:
  a housing having an upper part and a lower part, said upper light source device and said lower light source device being both located in said housing, said housing comprising air inlets and air outlets, said air inlets being part of the upper part of said housing, said air outlets being part of the lower part of said housing, so that an airflow may flow in through said air inlets and flow out through said air outlets.

10. The wafer optical processing device as claimed in claim 7, wherein the lower transparent baffle plate is provided with no holes.

11. A sintering furnace, comprising:
  a wafer sintering processing device; and
  a wafer optical processing device for optically processing a sintered wafer, the wafer optical processing device being disposed downstream of said wafer sintering processing device, and the wafer optical processing device comprising:
    a wafer support device, said wafer support device comprising a support piece, said support piece being provided with an upper surface and a lower surface that are disposed facing each other, said support piece being hollowed out in a direction from the upper surface to the lower surface, said support piece being configured to be capable of supporting said wafer above said upper surface;

an upper light source device, said upper light source device comprising a light source plate that is integrated with a plurality of light source modules, said upper light source device being disposed above said wafer support device and configured to provide a light source that illuminates the upper surface of said support piece; and a lower light source device, said lower light source device comprising a plurality of separate detachable light source modules, said lower light source device being disposed below said wafer support device and configured to provide a light source that illuminates the lower surface of said support piece.

12. The sintering furnace as claimed in claim 11, wherein said wafer support device comprises a conveyor belt provided with an upper surface, said conveyor belt forming said support piece.

13. The sintering furnace as claimed in claim 12, wherein a separation piece is disposed on said conveyor belt, said separation piece being configured to be capable of separating said wafer and the upper surface of said conveyor belt by a specific gap.

14. The sintering furnace as claimed in claim 11, wherein one or more of said plurality of light source modules of either the upper light source device or the lower light source device may be started when a wafer is optically processed.

15. The sintering furnace as claimed in claim 14, wherein said plurality of light source modules provide an LED light source.

16. The sintering furnace as claimed in claim 11, wherein the maximum light energy that said upper light source device is capable of providing per unit of time is greater than the maximum light energy that said lower light source device is capable of providing per unit of time.

17. The sintering furnace as claimed in claim 11, wherein said wafer optical processing device further comprises:

an upper transparent baffle plate, said upper transparent baffle plate being located between said upper light source device and said wafer support device and separated from said upper light source device, a plurality of holes being disposed in said upper transparent baffle plate;

and a lower transparent baffle plate, said lower transparent baffle plate being located between said lower light source device and said wafer support device and separated from said lower light source device.

18. The sintering furnace as claimed in claim 11, wherein said wafer optical processing device further comprises:

an upper cooling device, said upper cooling device being disposed above said upper light source device to cool said upper light source device, and a lower cooling device, said lower cooling device being disposed below said lower light source device to cool said lower light source device.

19. The sintering furnace as claimed in claim 11, wherein said wafer optical processing device further comprises:

a housing having an upper part and a lower part, said upper light source device and said lower light source device being both located in said housing, said housing comprising air inlets and air outlets, said air inlets being part of the upper part of said housing, said air outlets being part of the lower part of said housing, so that an airflow may flow in through said air inlets and flow out through said air outlets.

20. The wafer optical processing device as claimed in claim 8, wherein:

the upper cooling device comprises an upper cooling plate and an upper coil pipe configured to convey cooling fluid to transmit heat from the upper light source device to the cooling fluid via the upper cooling plate; and the lower cooling device comprises a lower cooling plate and a lower coil pipe configured to convey cooling fluid to transmit heat from the lower light source device to the cooling fluid via the lower cooling plate.

* * * * *